United States Patent [19]

Wakita

[11] Patent Number: 4,559,523
[45] Date of Patent: Dec. 17, 1985

[54] ANALOG TO DIGITAL CONVERTER
[75] Inventor: Toshiaki Wakita, Hiratsuka, Japan
[73] Assignee: Sony Corporation, Tokyo, Japan
[21] Appl. No.: 437,213
[22] Filed: Oct. 28, 1982
[30] Foreign Application Priority Data Oct. 30, 1981 [JP] Japan .................................. 56-174167

[51] Int. Cl.$^4$ ............................................. H03K 13/02
[52] U.S. Cl. ........................ 340/347 AD; 340/347 CC; 340/347 M; 371/72
[58] Field of Search .... 340/347 M, 347 AD, 347 CC; 371/72

[56] References Cited

U.S. PATENT DOCUMENTS 3,581,304 5/1971 Paradise et al. ............ 340/347 M X

Primary Examiner—T. J. Sloyan
Attorney, Agent, or Firm—Lewis H. Eslinger; Alvin Sinderbrand

[57] ABSTRACT

An analog to digital converter is disclosed, in which an analog input voltage is converted by a first analog to digital converter to a digital signal of m-bits, the digital signal is code-converted to a digital signal, this code-converted digital signal is converted by a digital to analog converter to an analog voltage, the difference between the last analog voltage and the above analog input voltage is converted by a second analog to digital converter to a digital signal of n-bits, and this digital signal of n-bits and the above code-converted digital signal are added to each other to provide a digital signal of (m+n) bits which corresponds to the analog input voltage.

7 Claims, 5 Drawing Figures

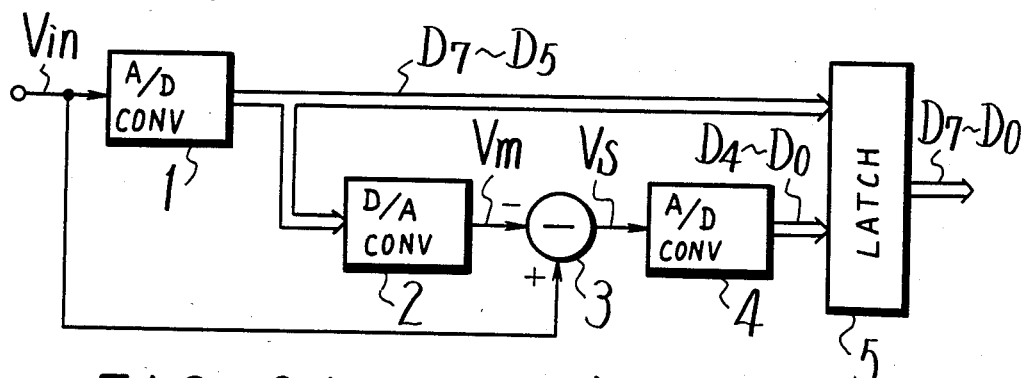
FIG. 1 (PRIOR ART)
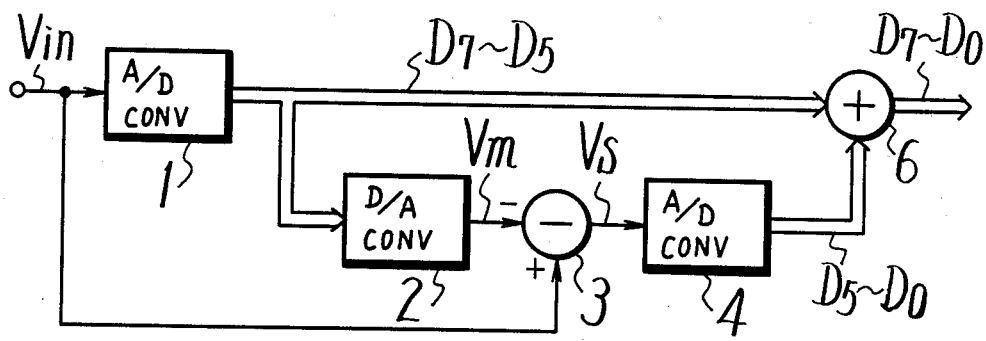
FIG. 2 (PRIOR ART)
FIG. 3
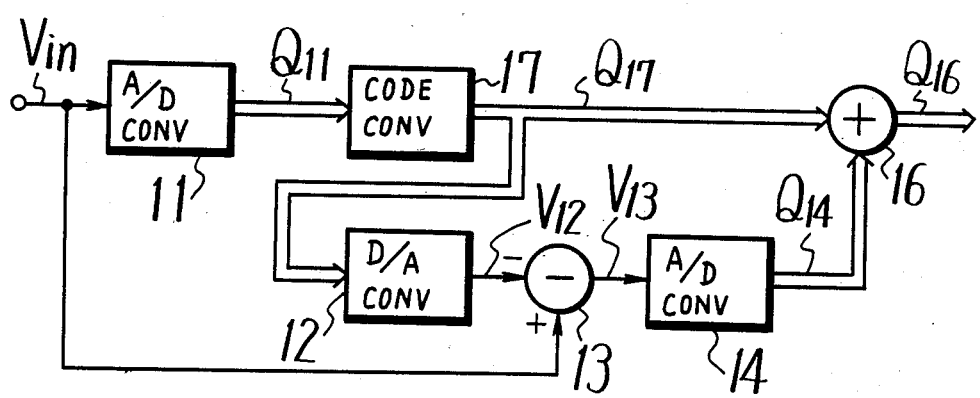
FIG. 4
| $Q_{11}$ | 0 | 1 | 2 | 3 | 4 | 5 | 6 | 7 |
|---|---|---|---|---|---|---|---|---|
| $Q_{17}$ | 0 | 28 | 56 | 84 | 112 | 140 | 168 | 196 |

4,559,523

ANALOG TO DIGITAL CONVERTER

BACKGROUND OF THE INVENTION

1. Field of the Invention

The present invention relates generally to an analog to digital converter and is directed more particularly to a novel analog to digital converter which is high in conversion efficiency.

2. Description of the Prior Art

In the prior art, when, for example, a luminance signal is converted from analog to digital form, an analog to digital (hereinafter referred to as A/D) converter of the serial parallel type such as shown in FIG. 1 may be employed.

The prior art A/D converter shown in FIG. 1 is used to carry out the A/D conversion to produce a digital signal of 8-bits. In this case, an analog input voltage $V_{in}$ is applied to a first A/D converter 1 with a 3 bit output corresponding to $D_7$ to $D_5$ the upper 3 bits of the 8 bit representation of the Vin. This 3-bit digital output $D_7$ to $D_5$ is supplied to a digital to analog (hereinbelow referred to as D/A) converter 2 and then converted thereby to an analog voltage $V_m$. This voltage $V_m$ and the input voltage $V_{in}$ are both applied to a subtracting circuit 3 from which a difference voltage $V_s = V_{in} - V_m$ is derived. This difference voltage $V_s$ is applied to an A/D converter 4 with a five bit output corresponding to $D_4$ to $D_0$, the lower 5 bits of the 8 bit representation of Vin. The digital outputs $D_7$ to $D_5$ and $D_4$ to $D_0$ are delivered through a latch 5 as an A/D converted output of 8-bits.

With the above serial-parallel type A/D converter, when the input voltage $V_{in}$ converted to a digital output of (m+n) bits, wherein m=3 and n=5 in the above example, that the total number of voltage comparing circuits required in the A/D converters 1 and 4 is only $2^m = 2^n - 2$. Therefore, when the A/D converter is formed as an integrated circuit, the number of voltage comparing circuits and its chip size can be reduced and its power consumption can be also reduced.

With this serial-parallel type A/D converter, however, the upper bit converter 1 requires the same accuracy as that of the lower bit converter 4. The reason is as follows.

That is, suppose the digital output bits $D_7$ to $D_0$ are to be increased by "1" from "31" to "32". In that case, the bits $D_7$ to $D_0$ change from "00011111" to "00100000", so that the lower bits $D_4$ to $D_0$ change from "11111" to "00000", while the upper bits $D_7$ to $D_5$ are changed from "000" to "001". Accordingly, when the converter shown in FIG. 1 is used, and the input voltage $V_{in}$ is increased from "31" to "32", the outputs $D_7$ to $D_5$ from the converter 1 change by "1" from "000" to "001". However, when the input voltage $V_{in}$ is changed from the value "28" to "29", the outputs $D_7$ to $D_5$ from the converter should not change from "000" to "001". This is true not only for the case when the input voltage $V_{in}$ is increased from "31" to "32" but also for the case when the input voltage $V_{in}$ is increased from "63" to "64", i.e. from $2^{k-1}$ to $2^k$, such that there is a carry from the bits $D_4$ to $D_O$ to the bits $D_7$ to $D_5$. Further, the above is true for a case where the input voltage $V_{in}$ is decreased and the bits $D_7$ to $D_5$ are shifted to the bits $D_4$ to $D_0$. Accordingly, even though the converter 1 has an output of 3-bits, the converter 1 requires 5 bit accuracy just as the converter 4.

If the converter 1 does not have this accuracy, the conversion contains the above-mentioned error, and the outputs $D_7$ to $D_0$ do not increase regularly over at the junction between $D_7$ to $D_5$ and $D_4$ to $D_0$.

To avoid the above defect, a prior art converter such as shown in FIG. 2 is proposed which compensates for the lack of accuracy of the converter 1. In this example, the converter 4 includes an extra, redundant bit to have 6-bits, and the 6 bits $D_5$ to $D_0$ output therefrom are added with the outputs $D_7$ to $D_5$ from the converter 1 in an adding circuit 6 such that bit $D_5$ from converter 1 and bit $D_5$ from converter 4 have the same weight, i.e. represent the same power of 2.

According to the converter shown in FIG. 2, even if the converter 1 is poor in accuracy, the correct digital outputs $D_7$ to $D_0$ can be obtained from the adding circuit 6 (the reason for this is conventional and will be omitted).

In the converter shown in FIG. 2, however, since the redundant bit is added, A/D conversion of 9 bits (512 steps) is allowable, i.e. 6 bits in converter 4 and 3 bits in converter 1, but only A/D conversion of 8 bits (256 steps) is actually performed, namely a half of the capacity is wasted.

OBJECTS AND SUMMARY OF THE INVENTION

It is an object of the present invention to provide a novel analog to digital (A/D) converter for converting an analog signal to a digital signal exactly.

A further object of the invention is to provide an efficient A/D converter with no redundant bits.

According to an aspect of the present invention there is provided an analog to digital converter, which comprises:

a first analog to digital converter for converting a first analog signal to a first digital signal;

a code converter for converting said first digital signal to a second digital signal;

a digital to analog converter for converting said second digital signal to a second analog signal;

a subtractor for subtracting said second analog signal from said first analog signal;

a second analog to digital converter for converting an output signal of said subtractor to a third digital signal; and an adder for adding said second digital signal and said third digital signal.

The other objects, features and advantages of the present invention will become apparent from the following description taken in conjunction with the accompanying drawings through which the like references designate the same elements and parts.

BRIEF DESCRIPTION OF THE DRAWINGS

FIGS. 1 and 2 are respectively block diagrams of prior art A/D converters;

FIG. 3 is a block diagram of an embodiment of the A/D converter according to the present invention;

FIG. 4 is a tabulation for illustrating the relation between a signal $Q_{11}$ and a signal $Q_{17}$.

DESCRIPTION OF THE PREFERRED EMBODIMENT

Figure 5:
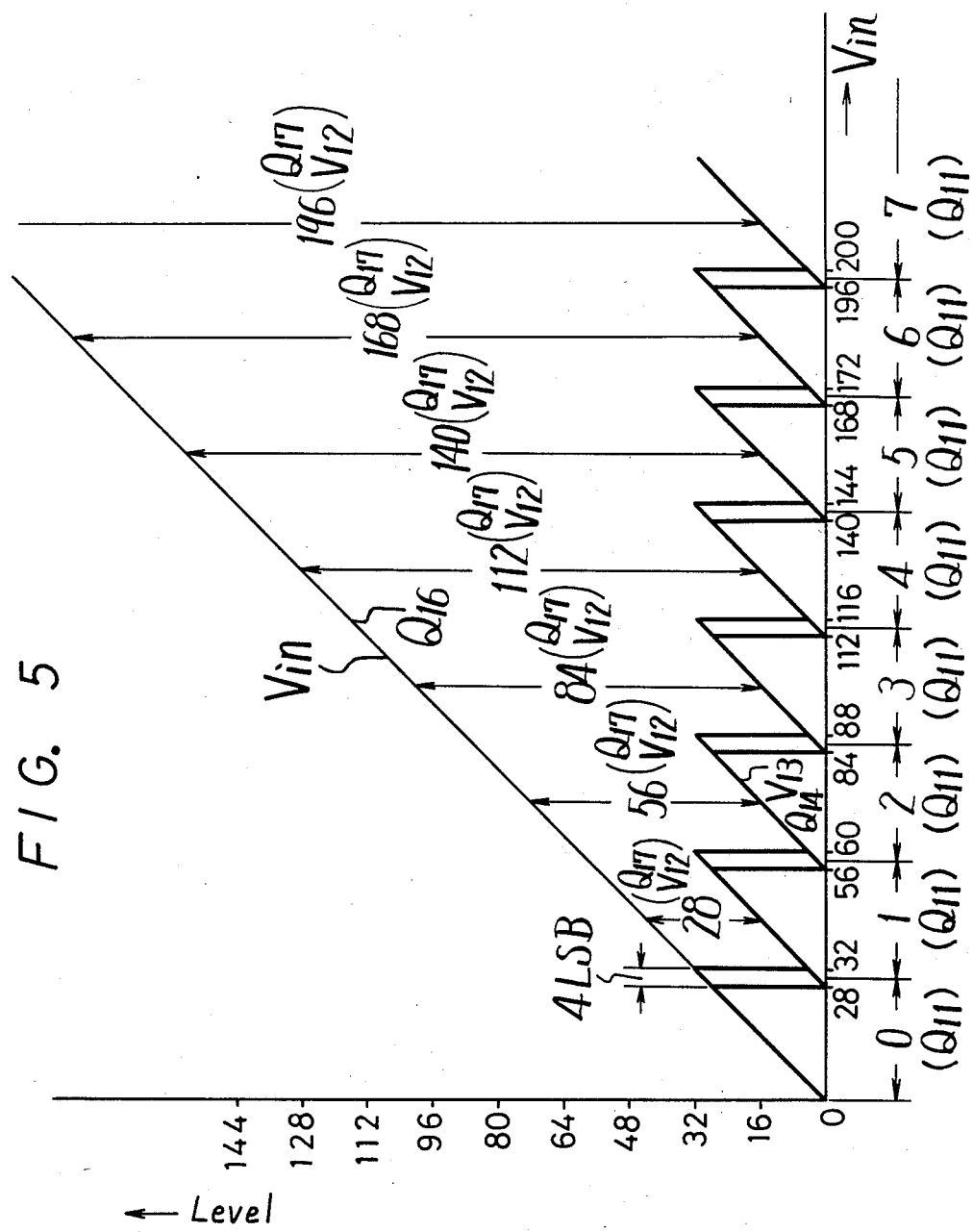
FIG. 5 is a graph showing the relation between an input signal $V_{in}$ and an output signal $Q_{14}$.

The present invention will be hereinbelow described with reference to the attached drawings. The novel A/D converter according to the present invention is free from the defects of the prior art serial to parallel type A/D converter.

An example of the A/D converter according to the invention will be now described with reference to FIG. 3.

In the embodiment of the invention shown in FIG. 3, the analog input voltage $V_{in}$ is applied to an A/D converter 11 with a 3 bit output to be converted to a digital value $Q_{11}$ of 3-bits thereby. In this case, let it be assumed that the conversion accuracy (scattering upon conversion) of the converter 11 is within $\pm 2$ LSB (least significant bit) of the final digital outputs $D_7$ to $D_0$. With this accuracy the value "28" of the lower 5 bits $D_4$ to $D_0$ may result in a change of "1" in the upper 3 bits and so is assumed to generate a "1" in the signal $Q_{11}$.

The signal $Q_{11}$ is supplied to a code-converter 17 formed of, for example, a ROM (read only memory), the output of which is a digital value $Q_{17}$ having 8 bits equal to 28 times the value $Q_{11}$ as shown in FIG. 4. This signal $Q_{17}$ is supplied to a D/A converter 12 to be converted to an analog voltage $V_{12}$. This voltage $V_{12}$ is applied to a subtracting circuit 13 which is also supplied with the input voltage $V_{in}$ so that the subtracting circuit 13 produces a difference voltage $V_{13} = V_{in} - V_{12}$.

The voltage $V_{13}$ is applied to an A/D converter 14 of with a 5 bit output and converted to a digital value $Q_{14}$. This signal $Q_{14}$ is supplied to an adding circuit 16 to which the signal $Q_{17}$ from the converter 17 is also supplied so that the adding circuit 16 produces an added signal $Q_{16} = Q_{14} + Q_{17}$ having 8 bits.

With the A/D converter of the invention constructed as described above, the output signal $Q_{16}$ becomes as follows:

$$Q_{16} = Q_{14} + Q_{17}$$
$$= V_{13} + Q_{17}$$
$$= (V_{in} - V_{12}) + Q_{17}$$
$$= V_{in} - Q_{17} + Q_{17}$$
$$= V_{in}$$

Thus, this signal $Q_{16}$ is the A/D converted representation of the input voltage $V_{in}$.

Now, the reasons for the above relations will be explained with reference to the graph of FIG. 5. As shown in FIG. 5, the output signal $Q_{11}$ from the A/D converter 11 is assumed to include the scattering of $\pm 2$ LSB so that for the signal $Q_{11}$ to be erroneously shifted to the next higher or lower value, an error width of 4 LSB is required. If the input voltage $V_{in}$ exists within this width or interval of 4 LSB, it is uncertain whether an error value of the signal $Q_{11}$ becomes the lower or higher value.

Further, since the output signal $Q_{17}$ from the code converter 17 is provided by merely code-converting the signal $Q_{11}$, the signal $Q_{17}$ also includes the same error for the input voltage $V_{in}$ and further the voltage $V_{12}$ provided by A/D converting the signal $Q_{17}$ so contains the same error. Accordingly, the difference voltage $V_{13} = V_{in} - V_{12}$ from the subtracting circuit 13 varies in sawteeth form with the input voltage $V_{in}$ and also includes uncertain widths of 4 LSB at step junctions.

Since the signal $Q_{14}$ provided by A/D converting the voltage $V_{13}$ is added to the signal $Q_{17}$ to form the output signal $Q_{16}$, the uncertain widths of 4 LSB are cancelled in the signal $Q_{16}$ and hence this signal does not contain this error.

As described above, according to the present invention, even if any error exists in the upper bits from A/D converter 11, the output signal $Q_{16}$ is not affected any thereby. Further, the redundant bit required in the prior art A/D converter shown in FIG. 2 is unnecessary in the A/D converter of this invention, so that the A/D converter of the invention has excellent efficiency.

In the embodiment of this invention, assuming that the number of bits in the output of first analog to digital converter (11) is m, which is 3 in this embodiment, and the number of bits in the output of second analog to digital converter (14) is n, which is 5 in this embodiment, the dynamic range becomes as follows;

$$\{2^n - (2+2)\} \times 2^m + 2 + 2 = 28 \times 8 + 2 + 2 = 228 \text{ (steps i.e. possible values)}$$

under the condition that there is $\pm 2$ LSB uncertain width at the step transitions portions.

It should be herein noted that $$2^n - (2+2) = 28$$

is equivalent to the multiplying factor of code converter (17). In other words, if the multiplying factor of the code converter (17) is expressed as T, T is obtained subtracting the uncertain widths of 4 LSB from the total number of steps 32 ($2^5$ in the second analog to digital converter). Therefore T is not arbitrary, but must be determined on basis of the number of bits in the first and second analog to digital converters and the error of the first analog to digital converter. This means that if the multiplying factor T lies in the range $$2^{m+n-1} < T \times 2^m < 2^{m+n}$$

it will be possible to operate the present analog to digital converter efficiently and exactly. Thus, the dynamic range of this A/D converter is narrower than the inherent value or 256 steps of 8-bits. However, when, for example, a luminance signal is A/D converted, the narrower dynamic range is enough and the above 228 steps are sufficient. If, however, 256 steps are required, an A/D converter having an larger output may be used as the A/D converter 11.

With the above embodiment of the invention, the input voltage $V_{in}$ is converted into the digital signal $Q_{16}$ ranging from "0" to "227", but if a different $Q_{17} = Q_{11} \times 8 + 16$ is used, the signal $Q_{16}$ ranges from "16" to "243" and hence the unused range can be distributed at the upper and lower sides of the signal $Q_{16}$.

The above description is given on a single preferred embodiment of the invention, but it will be apparent that many modifications and variations could be effected by one skilled in the art without departing from the spirit or scope of the novel concepts of the invention, so that the scope of the invention should be determined by the appended claims.

I claim as my invention:

1. An analog to digital converter for converting an input analog signal to an output digital signal having a total number of bits, comprising:

first analog to digital converter means having a predetermined error width and being operative for converting said input analog signal to a first digital signal having a first number of bits;

code converter means for converting said first digital signal to a second digital signal in accordance with said first number of bits, said total number of bits and said predetermined error width;

digital to analog converter means for converting said second digital signal to a second analog signal;

subtraction means for subtracting said second analog signal from said input analog signal and for producing an analog difference output signal;

second analog to digital converter means for converting said difference output signal of said subtraction means to a third digital signal; and adding means for adding said second digital signal and said third digital signal to generate said output digital signal.

2. An analog to a digital converter according to claim 1, wherein said output digital signal is represented with a predetermined number of total output bits and said third digital signal from said second analog to digital converter means constitutes at least one lower order bit of said total output bits.

3. An analog to digital converter according to claim 2, wherein said total number of bits is k, said first number of bits is m, and said third digital signal is represented with a number of lower order bits n, and $$m+n=K.$$

4. An analog to digital converter according to claim 1, wherein said code converter means converts said first digital signal to said second digital signal by multiplying the former by a predetermined value T.

5. An analog to digital converter according to claim 3, wherein said code converter means multiplies said first digital signal by a predetermined value T, where T satisfies the following conditions:

$$2^{k-1} < T \times 2^m < 2^k.$$

6. An analog to digital converter according to claim 1, wherein said total number of bits is k, said first number of bits is m, and said code converter means multiplies said first digital signal by a predetermined value T, wherein $$2^{k-1} < T \times 2^m < 2^k.$$

7. An analog to digital converter according to claim 1, wherein said code converter means includes a ROM.

* * * * *